United States Patent
Nojo et al.

(10) Patent No.: US 6,827,752 B2
(45) Date of Patent: Dec. 7, 2004

(54) CERIUM OXIDE SLURRY, AND METHOD OF MANUFACTURING SUBSTRATE

(75) Inventors: Haruki Nojo, Kanagawa (JP); Akitoshi Yoshida, Chiba (JP); Pascal Berar, Hayward, CA (US)

(73) Assignee: EKC Technology K.K., Kawasaki (JP)

( * ) Notice: Subject to any disclaimer, the term of this patent is extended or adjusted under 35 U.S.C. 154(b) by 0 days.

(21) Appl. No.: 10/333,643

(22) PCT Filed: May 24, 2002

(86) PCT No.: PCT/JP02/05066

§ 371 (c)(1),
(2), (4) Date: Mar. 12, 2003

(87) PCT Pub. No.: WO02/096999

PCT Pub. Date: Dec. 5, 2002

(65) Prior Publication Data

US 2003/0182868 A1 Oct. 2, 2003

(30) Foreign Application Priority Data

May 25, 2001 (JP) ........................................ 2001-157937

(51) Int. Cl.$^7$ ............................ C09G 1/02; C09G 1/04; B24B 37/00
(52) U.S. Cl. ............................... 51/307; 51/309; 106/3; 438/692; 438/693
(58) Field of Search ....................... 51/307, 309; 106/3; 423/263; 438/692, 693

(56) References Cited

U.S. PATENT DOCUMENTS

| | | | |
|---|---|---|---|
| 5,861,055 A | | 1/1999 | Allman et al. |
| 6,561,876 B1 | * | 5/2003 | Tateyama et al. ............. 451/41 |

FOREIGN PATENT DOCUMENTS

| EP | 1 223 609 A1 | 7/2002 |
|---|---|---|
| EP | 1 357 161 A2 | 10/2003 |
| JP | 8-22970 A1 | 1/1996 |
| JP | 10-168431 A1 | 6/1998 |
| JP | 2000-017195 A1 | 1/2000 |
| JP | 2000-109804 A1 | 4/2000 |
| JP | 2000-160137 A1 | 6/2000 |
| JP | 2000-248263 A1 | 9/2000 |
| WO | WO-02/083804 A1 | 10/2002 |
| WO | WO-02/096999 A1 | 12/2002 |

* cited by examiner

Primary Examiner—Michael Marcheschi
(74) Attorney, Agent, or Firm—Darby & Darby

(57) ABSTRACT

A problem to be solved is to provide a slurry that is capable of flattening an uneven film on a substrate with good precision, and that has good stability, not separating into two layers, solidifying through flocculated settling or undergoing changes in viscosity. This problem is solved by adding poly ammonium acrylates having different degrees of neutralization to one another as surfactants to a cerium oxide slurry containing cerium oxide particles, and suitably adjusting the total amount of polyacrylates added.

9 Claims, No Drawings

CERIUM OXIDE SLURRY, AND METHOD OF MANUFACTURING SUBSTRATE

CROSS REFERENCE TO PREVIOUS APPLICATION

This is a U.S. national phase application under 35 U.S.C. §371 of International Patent Application No. PCT/JP02/05066, filed May 24, 2002, and claims the benefit of Japanese Patent Application NO. 2001-157937, filed May 25, 2001. The international Application was published in English on Dec. 5, 2002 as WO 02/096999 A1 under PCT Article 21(2).

FIELD OF THE INVENTION

The present invention relates to slurry used in flattening by chemical mechanical polishing (hereinafter referred to as 'CMP'), which is a step in the manufacturing of semiconductor devices.

BACKGROUND ART

When manufacturing a semiconductor device, a multilayered structure in which a plurality of layers such as insulating films and metal films are laminated on a substrate is generally formed. When forming the multilayered structure, in general it is vital to carry out flattening by CMP to remove unevenness after laminating an interlayer insulating film, a metal film or the like on the substrate, before proceeding with building up wiring on top of the flattened surface. In recent years, as miniaturization of semiconductor devices has advanced, it has become necessary for each layer on the substrate to have a flatness of ever increasing precision. Much is thus expected of CMP, and the number of CMP flattening steps used in a semiconductor device manufacturing process has increased.

In recent years, cerium oxide slurries containing cerium oxide particles as abrasives have come to be used as the slurries used in these CMP steps. Cerium oxide slurries are characterized in that the hardness of the abrasives is high and hence the surface being polished is easily scratched, but the slurry reacts with the $SiO_2$ surface and hence the processing rate is high. Industrially, much is thus expected of cerium oxide slurries in terms of improving throughput. However, cerium oxide particles are heavy, having a density of 7.3 g/cm$^3$, and hence there is a problem that when a slurry solution is prepared, the cerium oxide particles tend to settle, resulting in the solution separating into two layers. Use in an industrial plant is thus problematic, with, for example, the supply pipes for slurry solution tending to become clogged. Moreover, art in which the flatness of the polished surface is improved by adding a surfactant is currently being developed. However, if a surfactant is added, settling of the cerium oxide particles is accelerated, making usage impossible in a plant in which slurry is supplied to each of the CMP devices from one large slurry storage tank. Each of the CMP devices must thus have its own slurry supply system as ancillary equipment, using up extra space in the clean room.

An example of a publicly known cerium oxide slurry and using method thereof is given in Japanese Patent Application Laid-open No. H8-22970, which discloses a method in which protruding parts only of a film to be polished can be preferentially polished by adding an organic compound of molecular weight at least 100 having a COOH group, a $COOM_1$ group (wherein $M_1$ is an atom or functional group for which a hydrogen atom of a carboxyl group can be substituted to form a salt), an $SO_3H$ group or an $SO_3M_2$ group (wherein $M_2$ is an atom or functional group for which a hydrogen atom of a sulfo group can be substituted to form a salt) to a slurry that has as the principal component thereof abrasives of $CeO_2$ or the like. According to this method, as described in Reference Example 1 below, an insulating film layer formed on a patterned substrate can be polished extremely well, with dishing being suppressed. However, settling of the cerium oxide particles in the slurry occurs extremely quickly, with the slurry solution already having separated into two layers 10 minutes after preparation, that is, the slurry solution severely lacks stability.

Moreover, Japanese Patent Application Laid-open No. 2000-17195 discloses a cerium oxide slurry that contains cerium oxide particles, a copolymer of ammonium acrylate and methyl acrylate, and water. As described in Reference Example 2 below, this slurry has relatively good stability, not separating into two layers even when left for up to 3 days or more after preparation. However, when an insulating film layer formed on a patterned substrate was polished as above using this slurry, dishing was occurred heavily and a flat surface could not be obtained.

Moreover, Japanese Patent No. 3130279 discloses a slurry composition for polishing characterized by containing abrasives of ceria or the like and a polymer electrolyte having a charge of different ionicity to the charge associated with the abrasives, wherein the molecular weight of the polymer electrolyte is between about 500 and about 10,000, and the amount of the polymer electrolyte relative to the abrasives is between about 5 wt % and about 50 wt %. According to this slurry composition, as described in Reference Example 3 below, an insulating film layer formed on an unpatterned substrate can be polished at a good polishing rate. However, when an insulating film layer formed on a patterned substrate was polished as above using this slurry composition, dishing was occurred heavily and a flat surface could not be obtained. Moreover, regarding the state of dispersion of the abrasives, it was found that the composition starts to separate into two layers after leaving for about 1 hour after preparation.

DISCLOSURE OF THE INVENTION

As described above, there is still no cerium oxide slurry having cerium oxide particles as abrasives that is both capable of flattening an uneven film on a substrate with good precision and for which the dispersibility of the abrasives is good. As miniaturization of semiconductor devices advances, the wavelength of the light used in exposure becomes shorter and hence the depth of focus decreases, and thus if flattening is not carried out well, the width of the wiring will fluctuate either side of the specification value, adversely affecting the semiconductor device yield. Moreover, if the cerium oxide slurry has poor stability, then the slurry must be prepared immediately before use, resulting in ancillary equipment for supplying the slurry becoming mandatory for each CMP device, and hence in much space being required in the clean room, as described above. Moreover, this will also result in the drawback of a large amount of time being required for maintenance of the slurry supply equipment.

To resolve the above problems relating to the slurry supply equipment, the idea of installing the slurry storage tank outside the clean room and supplying slurry to each of the CMP devices from there has been investigated. In this case, because the storage tank is installed outside of the clean room in which the CMP devices are installed, it becomes necessary to supply the slurry from the storage tank to the CMP devices using supply piping of length tens of meters or more. If the abrasives in the slurry settle and build up in bends and dead parts of the piping, then the resulting deposit will eventually be forced through the piping and be used for polishing substrates, resulting in problems such as many scratches appearing on the substrate surface during polishing or the filter at the outlet of the supply device becoming clogged up. Moreover, the concentration of abrasives at the usage point will fluctuate, damaging the stability of the polishing. As a result of these things, to implement the above method successfully, it is extremely important for the slurry to have reasonably good storage stability. In particular, the slurry must not separate into two layers, solidify through flocculated settling, undergo a change in viscosity or the like, and flocculated settling must not occur in bends or dead parts of piping as described above even if the slurry is circulated through the piping for a prolonged period of time.

Due to the above, there have been hopes that a slurry that is capable of flattening an uneven film on a substrate with good precision, and that has good stability, not separating into two layers, solidifying through flocculated settling or undergoing changes in viscosity, could be provided.

The inventors of the present invention conducted studies into solving the above problems, and as a result made an unexpected discovery that led to the present invention, namely that when polyacrylates are used as surfactants in a slurry, if polyacrylates having different degrees of neutralization to one another are used and the total polyacrylate content is suitably adjusted, then a stable slurry can be obtained with no impairment of polishing characteristics.

Specifically, in a first mode of the present invention, a cerium oxide slurry comprising cerium oxide particles, a first polyacrylate in which more than 90% of the carboxyl groups in a polyacrylic acid have been neutralized with ammonia, a second polyacrylate in which 15% to 50% of the carboxyl groups in a polyacrylic acid have been neutralized with ammonia, and water, wherein the total content of the first polyacrylate and the second polyacrylate is 0.15 wt % to 1 wt % of the cerium oxide slurry is provided.

In the first mode of the present invention, the pH is preferably 4 to 6.

Moreover, in a second mode of the present invention, a cerium oxide slurry comprising cerium oxide particles, a first polyacrylate in which more than 90% of the carboxyl groups in a polyacrylic acid have been neutralized with ammonia, a second polyacrylate in which 15% to 50% of the carboxyl groups in a polyacrylic acid have been neutralized with ammonia, xanthan gum, and water, wherein the total content of the first polyacrylate and the second polyacrylate is 0.15 wt % to 5 wt % of the cerium oxide slurry is provided.

In the second mode of the present invention, the content of the xanthan gum is preferably 0.01 wt % to 1 wt % of the cerium oxide slurry.

Moreover, in the first and second modes of the present invention, the weight average molecular weight of the first polyacrylate is preferably 2000 to 10000, and the weight average molecular weight of the second polyacrylate is preferably 1000 to 3000.

Moreover, in the first and second modes of the present invention, the content of the first polyacrylate is preferably 0.01 wt % to 0.1 wt % of the cerium oxide slurry.

In a third mode of the present invention, a method of manufacturing an inorganic substrate, characterized by including a step of polishing the substrate using one of the above cerium oxide slurries, is provided.

In the third mode of the present invention, the substrate is preferably a semiconductor substrate having an $SiO_2$ film.

PREFERRED EMBODIMENTS OF THE INVENTION

Firstly, a description will be given of the cerium oxide slurry in the first mode of the present invention.

Cerium oxide particles known as having a purity and crystal form allowing use with semiconductor devices can be used as the cerium oxide particles used in the cerium oxide slurry in the first mode of the present invention.

In such cerium oxide particles, the cerium oxide content is preferably at least 90 wt %, more preferably at least 98 wt %. Moreover, with regard to the particle diameter of the cerium oxide particles, considering that when the size of the particles is too small, the polishing rate for flattening a substrate will be impaired, and that when too large, flattening will be difficult and mechanical disadvantages such as the polished surface being scratched will arise, the mean particle diameter is preferably 10 nm to 6000 nm, more preferably 50 nm to 500 nm, yet more preferably 80 nm to 200 nm.

In the case of a slurry consisting of aggregate particles, the particle diameter can be measured using a laser diffraction/scattering type particle size distribution measuring device. In the case of a slurry consisting of monodispersion, the particle diameter can be measured, for example, using a dynamic light scattering type particle size distribution measuring device or a transmission electron microscope.

The cerium oxide particles can be manufactured, for example, by obtaining cerium hydroxide or the like from an aqueous solution of a cerium salt through neutralization or thermoaging, and then carrying out drying/baking followed by pulverization. Moreover, it is also possible to manufacture the cerium oxide particles using a ceria mist obtained from a raw material such as cerium chloride, cerium nitrate or an organic acid salt of cerium, using the same manufacturing method as with an ultrafine silica particle mist. Moreover, manufacture using ultrafine cerium oxide particles obtained from an organocerium compound by chemical vapor deposition is also possible.

The cerium oxide particle content in the first mode of the present invention is preferably 0.1 wt % to 30 wt %, more preferably 0.5 wt % to 10 wt %, of the slurry. By setting the cerium oxide particle content within such a range, a slurry for which a prescribed polishing rate can be secured economically can be obtained.

The cerium oxide slurry in the first mode of the present invention contains at least a first polyacrylate and a second polyacrylate having different degrees of neutralization to one another. By including a suitable amount of polyacrylates in the cerium oxide slurry, a function can be exhibited wherein, when flattening an uneven device by polishing, convex parts are preferentially polished while concave parts tend not to be polished. As a result, the flatness and uniformity of the surface of an article polished using the cerium oxide slurry of the present invention are good, and dishing in the case of an uneven film can be greatly reduced.

A poly ammonium acrylate in which more than 90% of the carboxyl groups in a polyacrylic acid have been neutralized with ammonia is used as the first polyacrylate in the first mode of the present invention. By including a polyacrylate having such a degree of neutralization in the slurry, the dispersibility of the cerium oxide particles can be made extremely good.

The degree of neutralization of the first polyacrylate in the first mode of the present invention is preferably at least 95%, more preferably at least 100%. Here, a degree of neutralization greater than 100% means that excess ammonia is added relative to the total amount of carboxyl groups in the polyacrylic acid.

The weight average molecular weight of the first polyacrylate in the first mode of the present invention is preferably 2000 to 10000, more preferably 4000 to 8000, yet more preferably 5000 to 7000. This is because, if the weight average molecular weight of the first polyacrylate is within such a range, the dispersibility of the cerium oxide particles can be maintained even better.

The content of the first polyacrylate in the first mode of the present invention is adjusted along with the content of the second polyacrylate to be described below such that the total content of the two polyacrylates is 0.15 wt % to 1 wt % of the slurry. If the total content of the two polyacrylates is within such a range, the dispersibility of the cerium oxide particles can be maintained extremely well while maintaining good polishing characteristics. The total content of the two polyacrylates is preferably 0.2 wt % to 0.6 wt %, more preferably 0.2 wt % to 0.5 wt %, of the slurry. Note that in the case that the total polyacrylate content is greater than 1 wt % of the slurry, the dispersibility of the cerium oxide particles can be well maintained by adding a thickener such as xanthan gum as described in the second mode below.

Moreover, the content of the first polyacrylate alone in the first mode of the present invention is preferably 0.01 wt % to 0.1 wt %, more preferably 0.03 wt % to 0.07 wt %, of the slurry. If the content of the first polyacrylate is within such a range, the dispersibility of the cerium oxide particles can be maintained even better.

A poly ammonium acrylate in which 15% to 50% of the carboxyl groups in a polyacrylic acid have been neutralized with ammonia is used as the second polyacrylate in the first mode of the present invention. If the degree of neutralization is less than 15%, then the polyacrylate will not completely dissolve in pure water, resulting in an uneven concentration when the slurry is prepared. Moreover, if the degree of neutralization is greater than 50%, then the pH will exceed the desired value. In the first mode of the present invention, it is preferable to set the degree of neutralization of the second polyacrylate such that the pH of the slurry becomes a prescribed value.

The weight average molecular weight of the second polyacrylate in the first mode of the present invention is preferably 1000 to 3000, more preferably 1500 to 3000. If the weight average molecular weight of the second polyacrylate is within such a range, then the protection of the polished surface by the polyacrylate during the polishing can be performed better. If the weight average molecular weight of the second polyacrylate is above the above-mentioned range, then the second polyacrylate adsorbs onto the surface to be polished in islands, and hence the abrasives become prone to cause scratches.

The cerium oxide slurry in the first mode of the present invention is preferably acidic, having a pH preferably in the range 4 to 6, more preferably in the range 4.5 to 5.5. This is because, if the slurry is acidic, then as described above, even if the total polyacrylate content is relatively low, protection of the polished surface can be performed better, and better flattening of the polished surface can be achieved. It is thought that the reason for this is that, if the slurry is acidic, then the polyacrylates adsorb onto the polished surface more strongly, and hence effective protection of the polished surface becomes possible even with a small amount of polyacrylates. Note, however, that this mechanism is pure hypothesis, and the present invention is not limited to this mechanism.

The cerium oxide slurry in the first mode of the present invention uses water as the dispersion medium. Moreover, one or more water-soluble organic solvents may be used together with the water, with examples including methyl alcohol, ethyl alcohol, isopropyl alcohol, ethylene glycol and glycerine. When water and one or more water-soluble organic solvents are used together, it is preferable to use about 0.05 wt % to 20 wt % of the one or more water-soluble organic solvents, more preferably 0.1 wt % to 2 wt %, relative to the water.

Various additives can be used in the cerium oxide slurry in the first mode of the present invention, so long as the effects of the present invention are not impaired. Examples of such additives include other surfactants, anticorrosives and chelating agents that can normally be used in slurries.

The cerium oxide slurry in the first mode of the present invention can be manufactured by adding the prescribed components to the water and dispersing. The dispersion may be carried out by using a dispersion bath equipped with a high-speed agitator, a homogenizer, an ultrasonic disperser, a ball mill, or the like. There are no particular limitations on the order in which the components are added.

Moving on, a description will now be given of the cerium oxide slurry in the second mode of the present invention. The cerium oxide slurry in the second mode comprises cerium oxide particles, a first polyacrylate as described above, a second polyacrylate as described above, xanthan gum, and water. The total content of the first polyacrylate and the second polyacrylate is 0.15 wt % to 5 wt % of the cerium oxide slurry.

The description of the cerium oxide particles used in the cerium oxide slurry in the second mode of the present invention is as for the first mode.

The cerium oxide slurry in the second mode of the present invention contains at least a first polyacrylate and a second polyacrylate having different degrees of neutralization to one another. With the exception of the amounts contained thereof, the first polyacrylate and the second polyacrylate used in the cerium oxide slurry in the second mode are as described in the first mode.

The content of the first polyacrylate in the second mode of the present invention is adjusted along with the content of the second polyacrylate such that the total content of the two polyacrylates is 0.15 wt % to 5 wt % of the slurry. In the slurry in the second mode, xanthan gum is included along with the polyacrylates, and as a result if the polyacrylates are included in an amount within the above range, together with the xanthan gum, the dispersibility of the cerium oxide particles can be maintained extremely well while maintaining good polishing characteristics. The total content of the two polyacrylates is preferably 0.01 wt % to 1 wt %, more preferably 0.05 wt % to 0.3 wt %, of the slurry.

Moreover the content of the first polyacrylate alone in the second mode of the present invention is preferably 0.01 wt % to 0.1 wt %, more preferably 0.03 wt % to 0.07 wt %, of the slurry. If the content of the first polyacrylate is within such a range, the dispersibility of the cerium oxide particles can be maintained even better.

The cerium oxide slurry in the second mode of the present invention contains xanthan gum, which is a polysaccharide.

By including xanthan gum, the dispersibility of the abrasives can be maintained extremely well and flocculated settling of the abrasives can be suppressed for a long time, regardless of the total polyacrylate content. Moreover, by using polyacrylates and xanthan gum together, the dispersion effects, wetting effects and frictional effects of the polyacrylates become better.

There are no particular limitations on the pH of the cerium oxide slurry in the second mode of the present invention, but the pH is preferably 4 to 10, more preferably 4.5 to 5.5. The characteristic feature of the second mode is that, by including xanthan gum, the polyacrylate content can be raised while still securing the dispersibility of the abrasives. Even if the slurry is neutral or alkaline, in which case the probability of adsorption onto the surface to be polished is low, for the above reasons the surface to be polished can be protected effectively and equal effects can be obtained.

The description of the dispersion media and additives that can be used in the cerium oxide slurry in the second mode of the present invention, and the description of the manufacturing method in the second mode, are as for the first mode.

Moving on, in a third mode of the present invention, a method of manufacturing an inorganic substrate that includes a step of polishing a prescribed substrate using a cerium oxide slurry according to the above-described first or second mode of the present invention is provided.

The prescribed substrate is an inorganic substrate such as a semiconductor substrate, for example a substrate in which an $SiO_2$ film is formed on top of a semiconductor substrate on which circuit components and wiring of tungsten, aluminum, copper or the like have been formed, a semiconductor substrate on which circuit components have been formed, or the like.

In the third mode of the present invention, a step is included in which the $SiO_2$ film formed on top of such a prescribed substrate is polished with one of the cerium oxide slurries described above, thus eliminating unevenness on the surface of the $SiO_2$ film and producing a flat surface across the whole of the semiconductor substrate. Specifically, a cerium oxide slurry according to the present invention is supported on an polishing cloth of a CMP device, and the film formed on top of the semiconductor substrate is polished. This polishing step using the cerium oxide slurry can be carried out using an ordinary method. There are no particular limitations on the polishing cloth, with it being possible to use a common nonwoven cloth, polyurethane foam, porous fluororesin or the like. Moreover, it is preferable for the polishing cloth to be subjected to grooving so that the slurry will collect in the resulting grooves.

For example, a CMP device that comprises a top ring having a driving device that holds and rotates the article to be polished, for example a semiconductor substrate as described above, and a rotatable lower polishing plate onto which a polishing pad (the polishing cloth) is stuck, with the top ring and the polishing plate facing one another, is used; a cerium oxide slurry according to the present invention is supported on the polishing cloth, and comes into contact with the rotating semiconductor substrate, with the cerium oxide slurry being continued to be fed onto the polishing cloth; the film formed on top of the substrate is polished at a polishing pressure of about 100 gf/cm$^2$ to 500 gf/cm$^2$, and thus flattened. There are no particular limitations on the speeds of rotation of the top ring and the polishing plate, and ordinarily used speeds of rotation can be adopted. For example, the speeds of rotation adopted can be about 40 rpm to 100 rpm for the top ring and also about 40 rpm to 100 rpm for the polishing plate.

After the polishing has been completed, it is preferable for the semiconductor substrate to be washed well with running water, then for water drops stuck to the semiconductor substrate to be removed using a spin dryer or the like, and then for the semiconductor substrate to be dried.

As described above, according to the present invention, a cerium oxide slurry is provided that gives high processing precision and has good stability, with flocculated settling of the cerium oxide particles, separation of the slurry into two layers, and changes in viscosity being suppressed. As a result, the slurry can be stored for a long time after preparation.

Moreover, even if the slurry is circulated for a prolonged time through supply piping of length a few tens of meters or more leading from a storage tank to the CMP devices, flocculated settling of the slurry does not occur in bends or dead parts of the supply piping and there is very little change in viscosity. Thus, the slurry supply equipments can all be replaced by the slurry storage tank outside the clean room, resulting in large economic merits.

Moreover, as described above, because the slurry does not settle and accumulate in bends or dead parts of the piping, scratches do not appear on the surface of the substrate during the polishing, and clogging of the filter at the outlet of the supply device does not occur.

Moreover, the slurry can be used effectively in flattening an oxide film such as an insulating/element-isolating silica film during a device flattening step, with flattening of good precision being achieved and dishing in case of a device having an uneven film being avoided.

EXAMPLES

Following is a description of examples of the present invention. Note, however, that the technical scope of the present invention is not limited to these examples.

Reference Example 1

A slurry was prepared following an example in Japanese Patent Application Laid-open No. H8-22970, and the dispersibility and polishing characteristics were investigated. The slurry was prepared by dispersing 1.0 wt % of cerium oxide particles of mean particle diameter 0.6 µm in pure water and adding 6.0 wt % of a poly ammonium carboxylate. The substrate polished was a silicon substrate patterned to a depth of 0.4 µm being such that protruding parts accounted for 50% of the whole substrate, with a silicon oxide film of thickness 1.3 µm formed thereupon (this silicon substrate shall hereinafter be referred to as 'silicon substrate 1'). The polishing conditions adopted were a polishing pressure of 300 gf/cm$^2$ and speeds of rotation of the polishing plate and the vacuum chuck holder of 100 rpm.

When the shape after polishing was observed, it was found that dishing had been suppressed and that an extremely good cross-sectional shape had been obtained. However, when the dispersibility of the slurry was investigated, it was found that the slurry was not stable, that is that the settling rate of the cerium oxide particles was high, with separation into two layers occurring 10 minutes after preparation of the slurry. It can thus be seen that the slurry of Reference Example 1 does not satisfy the requirements of both flatness and dispersibility.

Reference Example 2

A slurry was prepared following an example in Japanese Patent Application Laid-open No. 2000-17195, and the dispersibility and polishing characteristics were investigated. The slurry was prepared by mixing together 1 kg of cerium oxide particles, 23 g of a 40 wt % aqueous solution of a copolymer of ammonium acrylate and methyl acrylate, and 8977 g of deionized water, carrying out ultrasonic dispersion for 10 minutes while stirring, then filtering the slurry thus obtained using a 1-micron filter, and then adding more deionized water to make a 3 wt % slurry. Regarding the copolymer of ammonium acrylate and methyl acrylate, the weight average molecular weight of the copolymer was 10000, and the molar ratio of ammonium acrylate to methyl acrylate was 3:1. The substrates polished were a silicon substrate with a silicon oxide film formed thereupon (this silicon substrate shall hereinafter be referred to as 'silicon substrate 2'), and silicon substrate 1 as used in above-mentioned Reference Example 1. The polishing conditions adopted were a polishing pressure of 300 gf/cm$^2$ and a speed of rotation of the polishing plate of 30 rpm.

When the state of polishing was observed, with silicon substrate 2 it was found that a polishing rate of 600 nm/min was obtained. However, with silicon substrate 1, when the shape after polishing was observed, it was found that there was very bad dishing and that a flat shape had not been obtained. Even when the slurry was prepared again, this time adding 5 parts by weight of the copolymer per 100 parts by weight of the cerium oxide particles, a flat shape could not be obtained. When the dispersibility of the slurry was investigated, it was found that the slurry did not separate into two layers even when left for 3 days or more after preparation. It can be seen from the above that the slurry of Reference Example 2 does not satisfy the requirements of both flatness and dispersibility.

Reference Example 3

A slurry was prepared following the claims in Japanese Patent No. 3130279, and the dispersibility and polishing characteristics were investigated. The slurry was prepared by taking an aqueous solution in which 1.0 wt % of cerium oxide particles had been dispersed in water, and then adding an ammonium acrylate of average molecular weight 2000 having acidic polyions in an amount of 50 wt % relative to the abrasives to this aqueous solution. The pH of the slurry was 9.5, which is within a desirable range, and hence no particular adjustment was carried out. The substrates polished were silicon substrate 1 and silicon substrate 2. The polishing conditions adopted were a polishing pressure of 300 gf/cm$^2$, a speed of rotation of the polishing plate of 75 rpm, and a speed of rotation of the carrier of 50 rpm.

When the state of polishing was observed, with silicon substrate 2 it was found that a polishing rate of 450 nm/min was obtained. However, with silicon substrate 1, when the shape after polishing was observed, it was found that there was very bad dishing and that a flat shape had not been obtained. Moreover, when the dispersibility of the slurry was investigated, it was found that the slurry started to separate into two layers when left for 1 hour after preparation. It can be seen from the above that the slurry of Reference Example 3 does not satisfy the requirements of both flatness and dispersibility.

1. Relationship Between Degree of Neutralization of Polyacrylate, and Dispersibility and Flatness Slurries were prepared by adding poly ammonium acrylates of varying degrees of neutralization or a copolymer of ammonium acrylate and methyl acrylate in accordance with Table 1 to 10 g of cerium oxide particles of mean particle diameter 0.2 μm, making up to a total weight of 1 kg with pure water with stirring. Note that throughout this specification, molecular weights in the tables are weight average molecular weights.

For each of the slurries so prepared, the dispersibility of the cerium oxide particles and the flatness were investigated. The results are shown in Table 1.

The dispersibility tests were carried out by putting 100 g of a slurry in a polyvinyl chloride vessel of diameter 3.9 mm and leaving for 5 days, and in the case that the slurry separated into 2 layers, measuring the height of the supernatant. When the slurry separates into 2 layers, the larger the height of the supernatant, the worse the dispersibility; if the slurry does not separate into 2 layers, this shows that the dispersibility is extremely good. The flatness tests were carried out using silicon substrate 1, by polishing at a polishing pressure of 300 gf/cm$^2$, a speed of rotation of the polishing plate of 100 rpm, and a speed of rotation of the carrier of 100 rpm, and then observing the cross-sectional shape after polishing using an AFM (atomic force microscope). The flatness was evaluated according to the following criteria.

Flatness Criteria

○: Surface roughness (difference between protruding parts and recessed parts) less than 100 nm
Δ: Surface roughness at least 100 nm but less than 2 nm
X: Surface roughness at least 200 nm

TABLE 1

| Acrylate | Concentration (wt %) | pH | Height of supernatant After 1 day | After 3 days | After 5 days | Flatness |
|---|---|---|---|---|---|---|
| Polyacrylate (N: 20%; MW: 3000) | 0.01 | 5 | None | 3 mm | 5 mm | X |
| Polyacrylate (N: 90%; MW: 3000) | 0.01 | 8.8 | None | 1 mm | 3 mm | X |
| Polyacrylate (N: 100%; MW: 3000) | 0.01 | 9 | None | None | 1 mm | X |
| Copolymer of acrylate (N: 90%) and methyl acrylate (N: 100%) (MW: 10000; molar ratio: 3:1) | 0.01 | 9 | None | 3 mm | 5 mm | X |

"N" means degree of neutralization
"MW" means molecular weight

It can be seen from Table 1 that the state of dispersion of the cerium oxide particles is affected by the degree of neutralization of the polyacrylate, with the dispersibility improving as the degree of neutralization is increased, and the dispersibility being excellent when the degree of neutralization is 100%. However, in all cases, the flatness was not good.

2. Relationship between Degree of Neutralization and Amount Added of Polyacrylate, and Dispersibility and Flatness Slurries were prepared in accordance with Table 2, with the amount added of the poly ammonium acrylates and the ammonium acrylate/methyl acrylate copolymer from Table 1 being increased to 0.5 wt %. Dispersibility tests and flatness tests were carried out as in 1. above. The results are shown in Table 2.

TABLE 2

| Acrylate | Concentration (wt %) | pH | After 1 day | After 3 days | After 5 days | Flatness |
|---|---|---|---|---|---|---|
| Polyacrylate (N: 20%; MW: 3000) | 0.5 | 4.3 | 1 mm | 5 mm | 7 mm | Δ |
| Polyacrylate (N: 90%; MW: 3000) | 0.5 | 8.8 | None | 3 mm | 5 mm | X |
| Polyacrylate (N: 100%; MW: 3000) | 0.5 | 9 | None | None | 1 mm | X |
| Copolymer of acrylate (N: 90%) and methyl acrylate (N: 100%) (MW: 10000; molar ratio: 3:1) | 0.5 | 8.8 | 5 mm | 10 mm | 17 mm | X |

"N" means degree of neutralization
"MW" means molecular weight

It can be seen from Table 2 that there was no change in the state of dispersion upon increasing the amount added of the polyacrylate only when the degree of neutralization was 100%. Moreover, it can be seen that, for the polyacrylate having a degree of neutralization of 20%, even though the state of dispersion became worse upon increasing the amount added of the polyacrylate, the flatness after polishing was better than in the other cases.

3. Relationship Between Molecular Weight of Polyacrylate, and Dispersibility and Flatness A degree of neutralization for the polyacrylate of 100%, which is the degree of neutralization that gives the best state of dispersion, was adopted, and then slurries were prepared using poly ammonium acrylates of differing weight average molecular weight in accordance with Table 3. Dispersibility tests and flatness tests were carried out as in 1. above. The results are shown in Table 3.

TABLE 3

| Acrylate | Concentration (wt %) | pH | After 1 day | After 3 days | After 5 days | Flatness |
|---|---|---|---|---|---|---|
| Polyacrylate (N: 100%; MW: 2000) | 0.05 | 9 | None | None | 1 mm | X |
| Polyacrylate (N: 100%; MW: 3000) | 0.05 | 9 | None | None | 1 mm | X |
| Polyacrylate (N: 100%; MW: 6000) | 0.05 | 9 | None | None | None | X |

"N" means degree of neutralization
"MW" means molecular weight

Because polyacrylates having a degree of neutralization of 100% were used, relatively good dispersion results were obtained in all cases. When the weight average molecular weight of the polyacrylate was 6000, there was no sign whatsoever of the slurry separating into two layers.

From the above results, it can be seen that if emphasis is to be placed on the dispersibility of the abrasives then it is good to use a polyacrylate having a degree of neutralization of 100% and a weight average molecular weight of 6000, whereas if emphasis is to be placed on the flatness then it is preferable to use a polyacrylate having a low degree of neutralization.

4. Relationship Between Degree of Neutralization and Molecular Weight of Polyacrylate, and Dispersibility and Flatness With an aim of improving both the dispersibility and the flatness by using the above two types of polyacrylate in combination, slurries were prepared in accordance with Table 4. Dispersibility tests and flatness tests were carried out as in 1. above. The results are shown in Table 4.

TABLE 4

| First Polyacrylate | Second Polyacrylate | Molar ratio (1st:2nd) | Total concentratio (wt %) | pH | After 1 day | After 3 days | After 5 days | Flatness |
|---|---|---|---|---|---|---|---|---|
| Polyacrylate (N: 100%: MW: 6000) | Polyacrylate (N: 20%; MW: 2000) | 1:5 | 0.3 | 5 | None | None | None | ○ |
| Polyacrylate (N: 100%; MW: 6000) | Polyacrylate (N: 50%; MW: 3000) | 1:5 | 0.3 | 7 | None | None | 1 mm | Δ |
| Polyacrylate (N: 100%; MW: 6000) | Polyacrylate (N: 100%; MW: 10000) | 1:5 | 0.3 | 8.5 | None | None | 3 mm | X |

"N" means degree of neutralization
"MW" means molecular weight

It can be seen that there is little difference in the dispersibility between the three cases in Table 4, since in every case a polyacrylate having a degree of neutralization of 100% and a weight average molecular weight of 6000 is added; however, with regard to the polyacrylate having a degree of neutralization of 20%, the flatness is better if the weight average molecular weight is low, and moreover there is no impairment of the dispersibility in this case.

From the above, it can be seen that to satisfy the requirement of both a good dispersibility and a good flatness, it is good to use two polyacrylates having different degrees of neutralization to one another, and moreover that it is preferable for these two polyacrylates to have different weight average molecular weights to one another.

5. Relationship Between Total Polyacrylate Content, and Dispersibility and Flatness In the above tests, an $SiO_2$ film was used as the film to be polished, but in some cases BPSG (boron phosphorus doped silicate glass) in which B and P are doped is used between layers in a semiconductor device. In such a case, boron and phosphorus are released from the film during the polishing and react with active sites in the additives, resulting in a reduction in the flatness improvement effect. Consequently, a larger amount of additives is required than when a normal $SiO_2$ film is polished.

Slurries having different total amounts of the two polyacrylates added were prepared in accordance with Table 5, and dispersibility tests and flatness tests were carried out. In the flatness tests, the substrate polished was a silicon substrate patterned to a depth of 0.4 μm being such that protruding parts accounted for 50% of the whole substrate, with BPSG of thickness 1.3 μm formed thereupon, and polishing was carried out using the same polishing conditions as in 1. above. The results are shown in Table 5.

TABLE 5

| First Polyacrylate | Second Polyacrylate | Molar ratio (1st:2nd) | Total concentratio (wt %) | pH | Height of Supernatant After 1 day | After 3 days | After 5 days | Flatness |
|---|---|---|---|---|---|---|---|---|
| Polyacrylate (N: 100%: MW: 6000) | Polyacrylate (N: 20%; MW: 3000) | 1:5 | 0.3 | 5 | None | None | None | X |
| Polyacrylate (N: 100%; MW: 6000) | Polyacrylate (N: 20%; MW: 3000) | 1:19 | 1 | 5 | 1 mm | 3 mm | 5 mm | X |
| Polyacrylate (N: 100%; MW: 6000) | Polyacrylate (N: 20%; MW: 3000) | 1:59 | 5 | 5 | 15 mm | All settled | All settled | ○ |
| Polyacrylate (N: 100%; MW: 6000) | Polyacrylate (N: 20%; MW: 3000) | 1:99 | 5 | 5 | All settled | All settled | All settled | ○ |

"N" means degree of neutralization
"MW" means molecular weight

It can be seen from Table 5 that 3 wt % of polyacrylates is necessary for improving the flatness. However, it can also be seen that if the total amount of polyacrylates is greater than 1 wt %, then flocculation of the cerium oxide particles starts to occur.

6. Relationship Between Total Amount of Polyacrylates Added and Xanthan Gum, and Dispersibility and Flatness To improve the state of dispersion in the case that the total amount of polyacrylates added is more than 1 wt %, slurries were prepared with xanthan gum additionally added in accordance with Table 6. Dispersibility tests and flatness tests were carry out as in 5. above. The results are shown in Table 6.

TABLE 6

| First Polyacrylate | Second Polyacrylate | Molar ratio (1st:2nd) | Xanthan gum concentratio (wt %) | pH | Height of Supernatant After 1 day | After 3 days | After 5 days | Flatness |
|---|---|---|---|---|---|---|---|---|
| Polyacrylate (N: 100%: MW: 6000) | Polyacrylate (N: 20%; MW: 3000) | 1:79 | 0.01 | 5 | None | 1 mm | 5 mm | ○ |
| Polyacrylate (N: 100%; MW: 6000) | Polyacrylate (N: 20%; MW: 3000) | 1:79 | 0.05 | 5 | None | None | None | ○ |
| Polyacrylate (N: 100%; MW: 6000) | Polyacrylate (N: 20%; MW: 3000) | 1:79 | 0.1 | 5 | None | None | None | ○ |
| Polyacrylate (N: 100%; MW: 6000) | Polyacrylate (N: 20%; MW: 3000) | 1:79 | 0.5 | 5 | None | None | None | ○ |

"N" means degree of neutralization
"MW" means molecular weight

It can be seen from Table 6 that there is no worsening of the flatness upon adding xanthan gum, that is that the polishing characteristics are not affected by adding xanthan gum. Moreover, it can also be seen that the dispersibility of the cerium oxide particles can be maintained by adding about 0.05 wt % of xanthan gum.

According to the cerium oxide slurry of the present invention, there is virtually no flocculated settling of the cerium oxide and also very little change in viscosity. As a result, an uneven film on a substrate can be flattened with good precision, and without the surface of the polished substrate being scratched.

What is claimed is:

1. A cerium oxide slurry, comprising:

cerium oxide particles;

a first polyacrylate in which more than 90% of the carboxyl groups in a polyacrylic acid have been neutralized with ammonia;

a second polyacrylate in which 15% to 50% of the carboxyl groups in a polyacrylic acid have been neutralized with ammonia; and water;

wherein the total content of said first polyacrylate and said second polyacrylate is in a range of 0.15 wt % to 1 wt % of said cerium oxide slurry.

2. The cerium oxide slurry according to claim 1, wherein said cerium oxide slurry has a pH in a range of 4 to 6.

3. A cerium oxide slurry, comprising:

cerium oxide particles;

a first polyacrylate in which more than 90% of the carboxyl groups in a polyacrylic acid have been neutralized with ammonia;

a second polyacrylate in which 15% to 50% of the carboxyl groups in a polyacrylic acid have been neutralized with ammonia;

xanthan gum; and water;

wherein the total content of said first polyacrylate and said second polyacrylate is in a range of 0.15 wt % to 5 wt % of said cerium oxide slurry.

4. The cerium oxide slurry according to claim 3, wherein the content of said xanthan gum is in a range of 0.01 wt % to 1 wt % of said cerium oxide slurry.

5. The cerium oxide slurry according to any of claim 1, wherein said first polyacrylate has a weight average molecular weight in a range of 2000 to 10000.

6. The cerium oxide slurry according to claim 1, wherein said second polyacrylate has a weight average molecular weight in a range of 1000 to 3000.

7. The cerium oxide slurry according to any of claim 1, wherein the content of said first polyacrylate is in a range of 0.01 wt % to 0.1 wt % of said cerium oxide slurry.

8. A method of manufacturing an inorganic substrate, characterized by including a step of polishing said inorganic substrate using the cerium oxide slurry according to claim 1.

9. The method of manufacturing an inorganic substrate according to claim 8, wherein said inorganic substrate is a semiconductor substrate having an $SiO_2$ film.

* * * * *